United States Patent
Seo et al.

(10) Patent No.: US 10,748,962 B2
(45) Date of Patent: Aug. 18, 2020

(54) METHOD AND STRUCTURE FOR FORMING MRAM DEVICE

(71) Applicant: International Business Machines Corporation, Armonk, NY (US)

(72) Inventors: Soon-Cheon Seo, Glenmont, NY (US); Seyoung Kim, White Plains, NY (US); Injo Ok, Loudonville, NY (US); Choonghyun Lee, Rensselaer, NY (US); Kisup Chung, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 15/960,670

(22) Filed: Apr. 24, 2018

(65) Prior Publication Data

US 2019/0326354 A1   Oct. 24, 2019

(51) Int. Cl.
| | |
|---|---|
| *H01L 27/22* | (2006.01) |
| *H01L 43/12* | (2006.01) |
| *H01L 43/10* | (2006.01) |
| *H01L 43/02* | (2006.01) |
| *H01L 43/08* | (2006.01) |

(52) U.S. Cl.
CPC ............ *H01L 27/226* (2013.01); *H01L 43/02* (2013.01); *H01L 43/08* (2013.01); *H01L 43/10* (2013.01); *H01L 43/12* (2013.01)

(58) Field of Classification Search
CPC ..... H01L 27/222–228; H01L 21/76843; H01L 43/12
See application file for complete search history.

(56) References Cited

U.S. PATENT DOCUMENTS

| | | | |
|---|---|---|---|
| 6,703,654 B1 | 3/2004 | Horng et al. | |
| 7,291,506 B2 | 11/2007 | Nakajima et al. | |
| 7,508,700 B2 | 3/2009 | Zhong et al. | |
| 7,531,367 B2 | 5/2009 | Assefa et al. | |
| 8,772,888 B2 | 7/2014 | Jung et al. | |
| 8,829,580 B2 | 9/2014 | Sugiura et al. | |
| 9,231,193 B2 | 1/2016 | Iwayama et al. | |
| 9,564,577 B1 | 2/2017 | Hsu et al. | |
| 9,608,195 B2 | 3/2017 | Huang et al. | |

(Continued)

OTHER PUBLICATIONS

Kasko, Ihar et al., "MTJ Patterning by Collimated Deposition and CMP", IPC0M000019668D, Sep. 24, 2003.

(Continued)

*Primary Examiner* — Raj R Gupta
(74) *Attorney, Agent, or Firm* — Harrington & Smith

(57) ABSTRACT

A method of forming a bottom electrode for MRAM comprises: depositing a conductive material into a trench in a substrate and planarizing; depositing a selective cap on the conductive material; depositing a layer of high stress material on upper surfaces of the substrate and the cap; patterning the high stress material to remove the layer of high stress material on the upper surfaces of the substrate and leaving the layer of high stress material on the upper surfaces of the cap; depositing a layer of dielectric material on the upper surfaces of the substrate and on upper surfaces of the high stress material on the cap; planarizing the layer of dielectric material; and forming a magnetic tunnel junction stack on the dielectric material over the conductive material.

8 Claims, 15 Drawing Sheets

(56) References Cited

U.S. PATENT DOCUMENTS

| | | | |
|---|---|---|---|
| 2009/0166869 A1 | 7/2009 | Jang | |
| 2011/0244680 A1* | 10/2011 | Tohnoe | H01L 21/02074 |
| | | | 438/677 |
| 2013/0062714 A1* | 3/2013 | Zhu | G11C 11/16 |
| | | | 257/421 |
| 2015/0255507 A1 | 9/2015 | Pakala et al. | |
| 2016/0172488 A1* | 6/2016 | Oh | H01L 29/7827 |
| | | | 257/330 |
| 2016/0274198 A1* | 9/2016 | Naik | G01R 33/098 |

OTHER PUBLICATIONS

Leduc, P., et al., "Understanding CMP-induced delamination in ultra low-k/Cu integration", Proceedings of the IEEE 2005 International Interconnect Technology Conference, 2005, pp. 209-211.

* cited by examiner

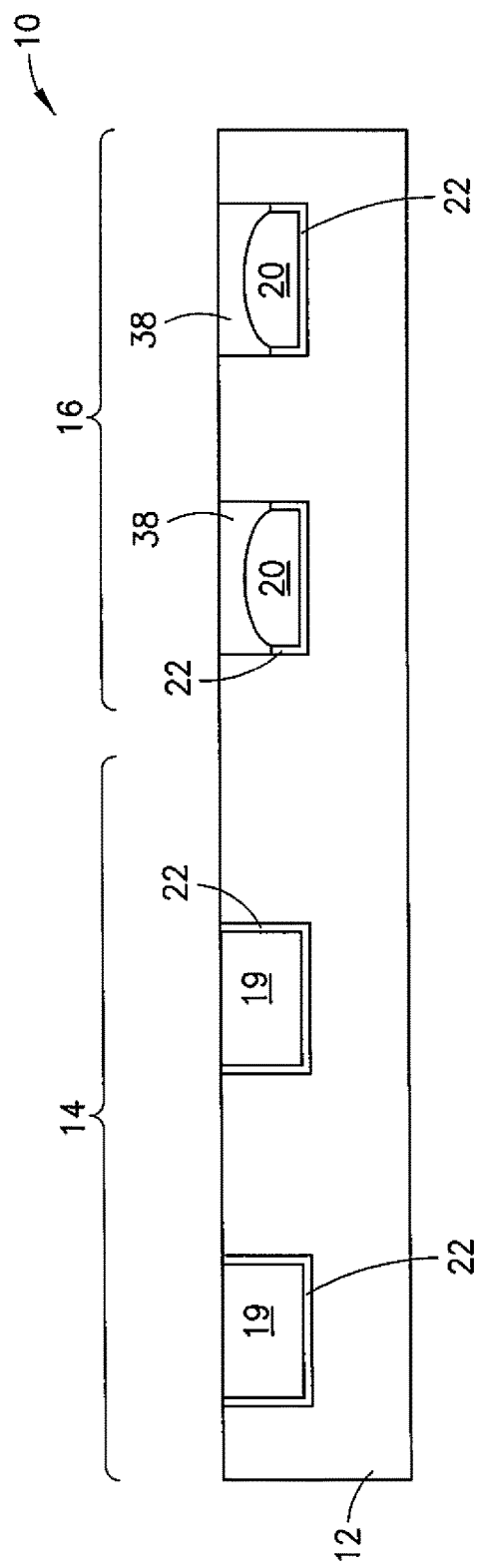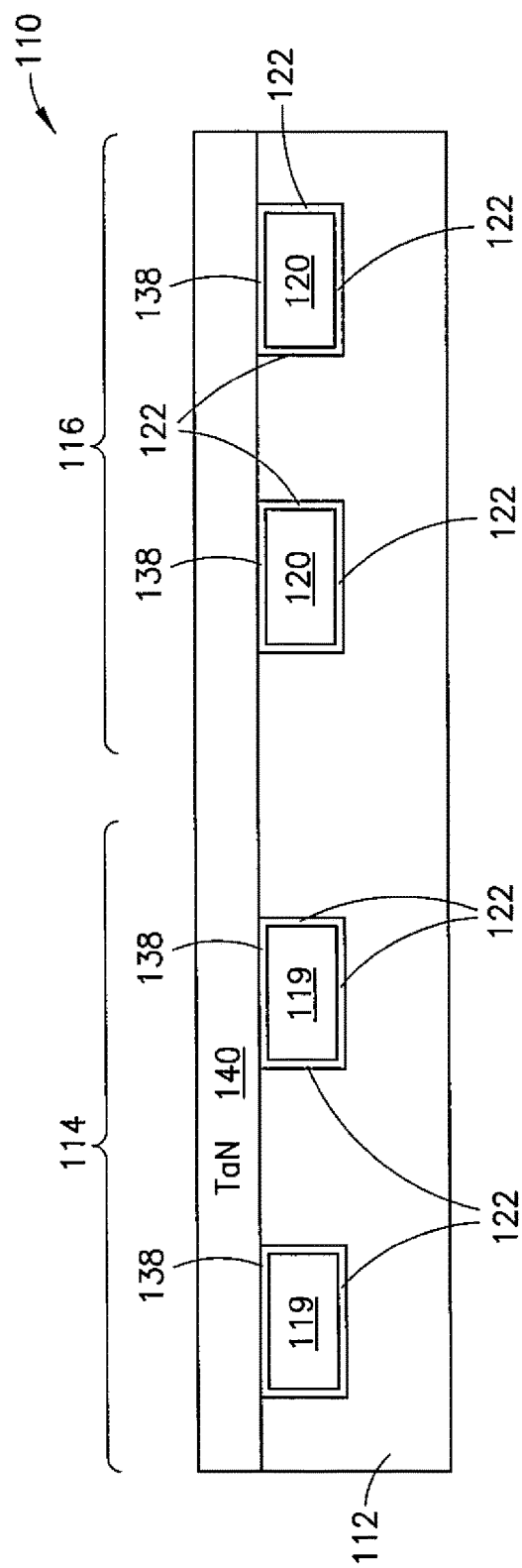

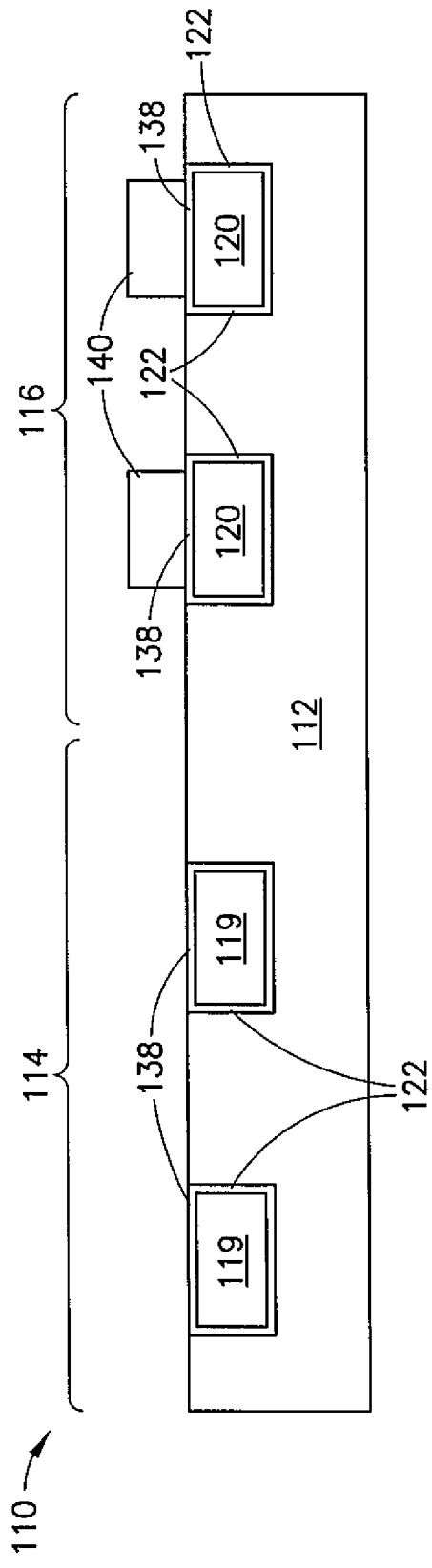
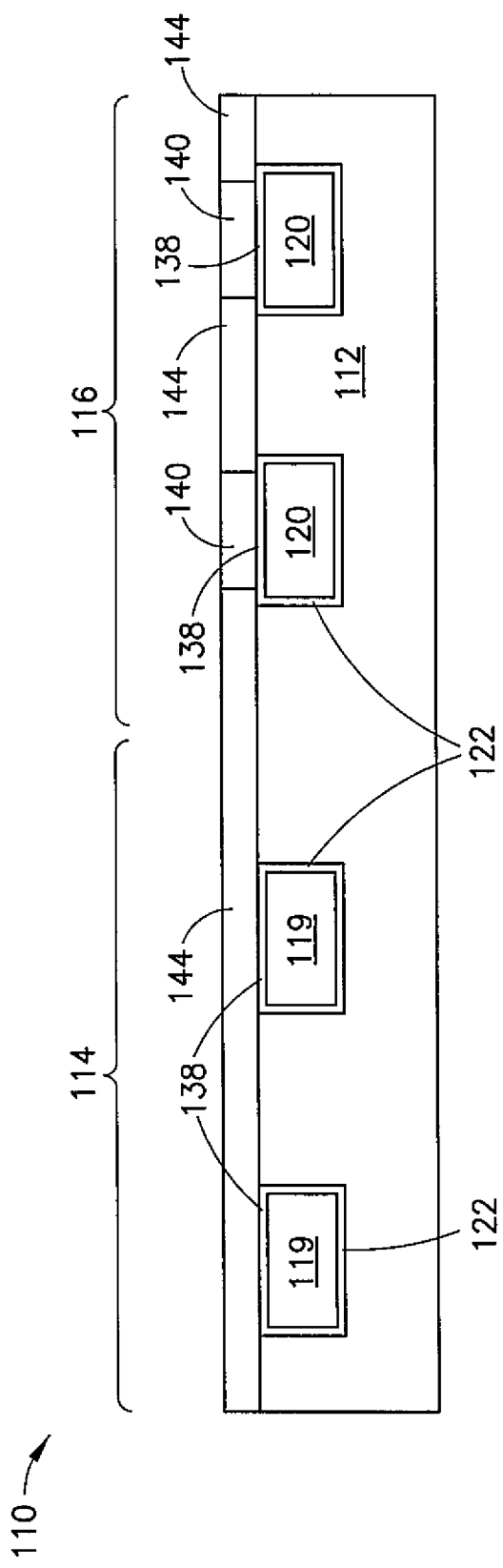

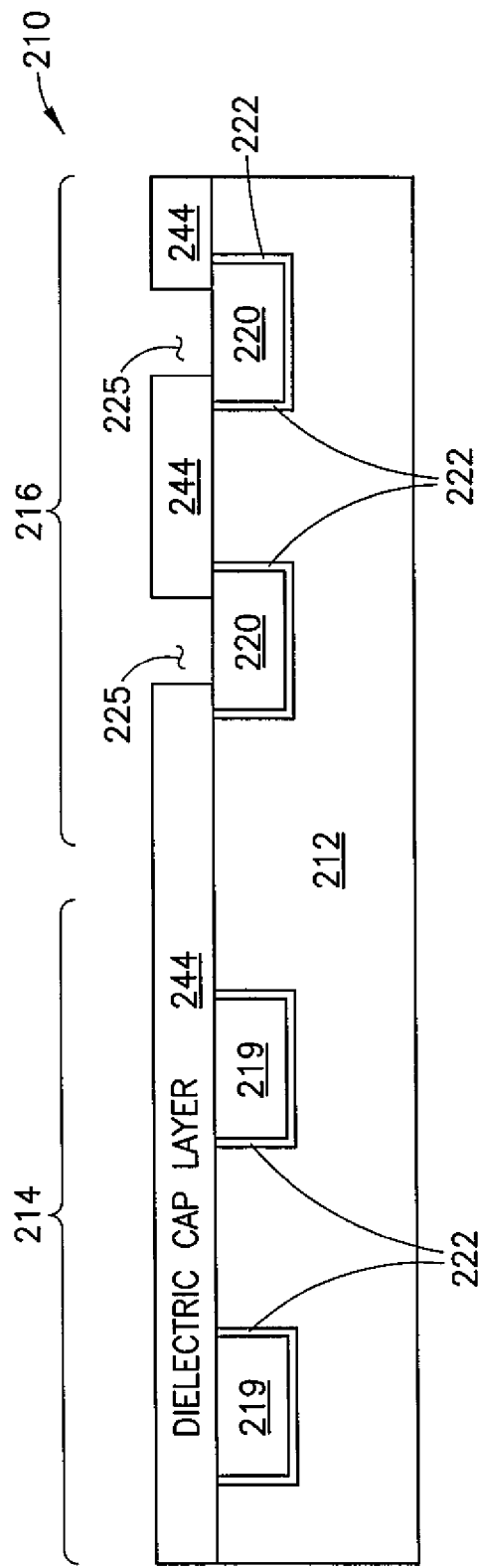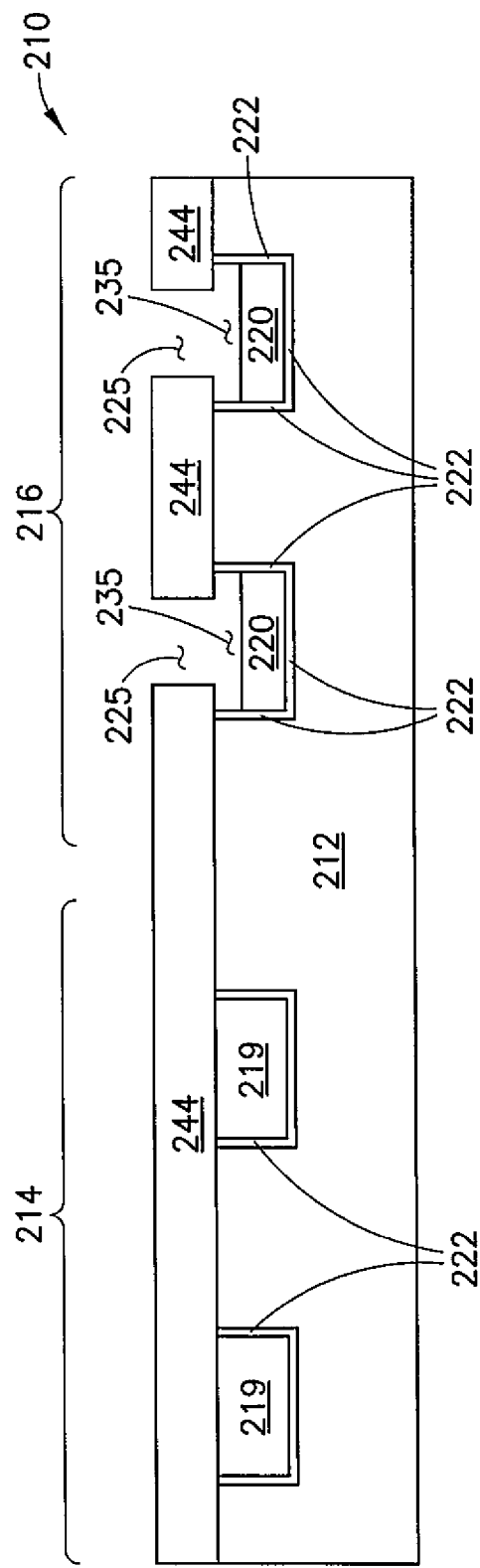

US 10,748,962 B2

METHOD AND STRUCTURE FOR FORMING MRAM DEVICE

BACKGROUND

The exemplary embodiments described herein relate generally to semiconductor devices and methods of forming such devices and, more specifically, to semiconductor devices comprising magnetoresistive random-access memory (MRAM) structures and methods for the formation thereof.

Magnetoresistive random-access memory (MRAM) is a non-volatile random access memory technology in which data is stored using magnetic storage elements. The elements are formed as a magnetic tunnel junction (MTJ), which is a cell formed by the arrangement of two ferromagnetic layers, each of which can hold a magnetization, separated by a thin insulating layer that forms a tunnel barrier. One of the ferromagnetic layers may be a permanent magnet of a particular polarity, whereas the magnetization of the other layer may be a writable layer that is matched to that of an external field to store data. Generally, for two layers having the same magnetization alignment (for example, arranged in parallel), the resistance state is low and is assigned a value of "1." If the two layers have magnetizations that are in anti-parallel alignment, the resistance state will be considered to be high and will be assigned a value of "0." A plurality of such cells arranged in grid form forms a memory device.

Methodologies for the formation of MRAM structures in the prior art involve the use of an etching process to form self-aligning bottom electrodes which are used to connect an MRAM structure to an access transistor. MRAM formation processes are carried out in which copper is deposited in an MRAM area of a substrate, the copper is then recessed, the recessed areas are filled with tantalum nitride (TaN) or titanium nitride (TiN), and the MRAM area is subsequently subjected to a chemical mechanical polish (CMP) to planarize the surface. However, during planarization, the TaN or TiN often delaminates from the copper. Additionally, during physical ion mill etching processes in which tapered profiles of the magnetic tunnel junction (MTJ) pillars are corrected, shorting across the magnetic tunnel junction and damage to dielectric material around the MTJ pillars may occur.

BRIEF SUMMARY

In accordance with one aspect, a method of forming a bottom electrode for MRAM comprises: depositing a conductive material into a trench in a substrate and planarizing; depositing a cap on the conductive material; depositing a layer of high stress material on upper surfaces of the substrate and the cap; patterning the high stress material to remove the layer of high stress material on the upper surfaces of the substrate and leaving the layer of high stress material on the upper surfaces of the cap; depositing a layer of dielectric material on the upper surfaces of the substrate and on upper surfaces of the high stress material on the cap; planarizing the layer of dielectric material; and forming a magnetic tunnel junction stack on the dielectric material over the conductive material.

In accordance with another aspect, a method of forming a magnetic tunnel junction for MRAM comprises: providing a substrate having a bottom electrode; depositing a layer of dielectric material on upper surfaces of the substrate and the bottom electrode; depositing a plurality of magnetic tunnel junction layers on the layer of conducting metal material; depositing a top electrode hardmask layer on an upper layer of the plurality of magnetic tunnel junction layers; depositing a stack hardmask on an upper surface of the top electrode hardmask layer; patterning the stack hardmask with a lithographic technique; milling the plurality of magnetic tunnel junction layers, the layer of conducting metal material, and the substrate to form a magnetic tunnel junction stack having tapered side surfaces; forming spacers on the tapered side surfaces; and etching to remove the layer of conducting metal material on the upper surface of the substrate and leaving the layer of dielectric material under the spacers and the plurality of magnetic tunnel junction layers.

In accordance with another aspect, a structure for MRAM comprises: a substrate of interlayer dielectric material; an electrode comprising a conductive material disposed in a trench in the substrate; a cap material disposed on an upper surface of the electrode; a layer of conducting metal material disposed on the cap material; a plurality of magnetic tunnel junction layers disposed on the layer of conducting metal material; a top electrode hardmask layer disposed on an upper layer of the plurality of magnetic tunnel junction layers; a stack hardmask disposed on an upper surface of the top electrode hardmask layer; one or more spacers disposed alongside surfaces of the layer of conducting metal material, the plurality of magnetic tunnel junction layers, the top electrode hardmask layer, and the stack hardmask.

In accordance with another aspect, a method of forming a hybrid bottom electrode for MRAM comprises: depositing a conductive material into a trench in a substrate and planarizing; depositing a dielectric cap on the conductive material; forming an opening in the dielectric cap to expose the conductive material; recessing the conductive material through the opening; depositing a metal cap layer on the conductive material through the opening; planarizing the metal cap layer and the dielectric cap; and forming a magnetic tunnel junction stack over the conductive material.

BRIEF DESCRIPTION OF THE SEVERAL VIEWS OF THE DRAWINGS

The foregoing and other aspects of exemplary embodiments are made more evident in the following Detailed Description, when read in conjunction with the attached Drawing Figures, wherein:

FIGS. 1 through 4 are schematic representations of a currently employed method of forming an electrode of an MRAM device;

FIGS. 5 through 7 are schematic representations of one exemplary method of forming an electrode of an MRAM device;

FIGS. 8 through 10 are schematic representations of one exemplary embodiment of forming a hybrid electrode of an MRAM device;

DETAILED DESCRIPTION

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

Figure 1:
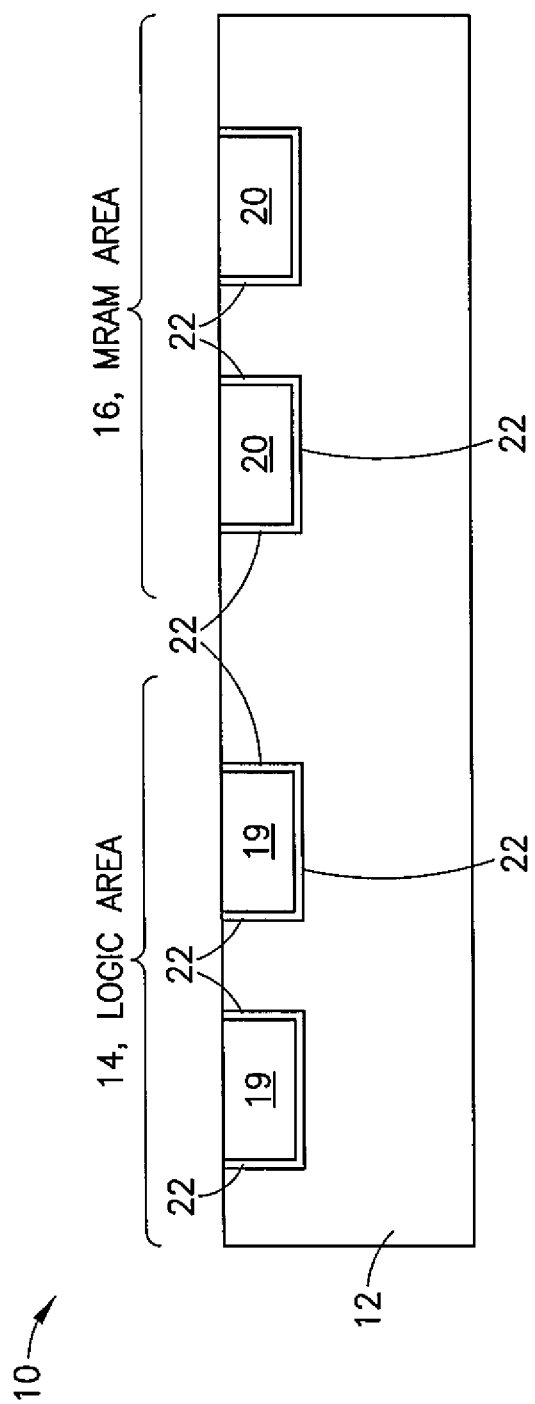

In order to provide technological context, a method of forming a bottom electrode of an MRAM device is illustrated in FIGS. 1 through 4. As shown in FIG. 1, in an MRAM device 10, a substrate 12 comprising an interlayer dielectric (ILD) material is provided. Substrate 12 may be partitioned into at least one logic area 14 and at least one MRAM area 16, the logic area 14 and the MRAM area 16 being etched to form trenches and subjected to one or more deposition processes to form metallization patterns in the trenches, the metallization patterns in the logic area 14 forming back-end wiring patterns 19 and the metallization patterns in the MRAM area 16 forming the electrodes 20. The electrodes 20 may comprise any conductive metal suitable for forming points of electrical contact between an MRAM structure and a transistor. The wiring patterns 19 may also comprise conductive metal. Suitable conductive metals include, but are not limited to, copper, aluminum, tungsten, and the like, as well as alloys thereof. Diffusion barriers 22 may be located between the electrodes 20 and the substrate 12, such diffusion patterns 22 comprising, for example, TaN, TiN, or the like.

Figure 2:
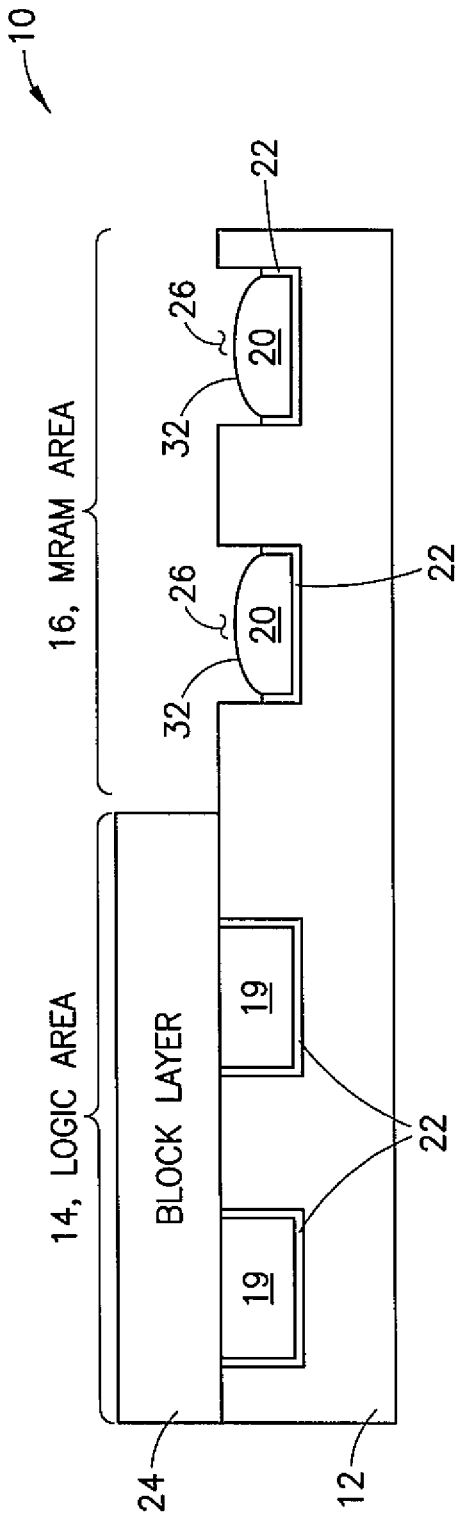

Referring to FIG. 2, a block layer 24 may be disposed on the substrate 12 to mask off the wiring patterns 19 in the logic area 14. In the MRAM area 16, the electrodes 20 and the diffusion barriers 22 may be subjected to an anisotropic reactive ion etch (RIE) to recess the materials thereof to form recessed areas 26 over the electrodes 20. Control issues, however, may result from the etching, thereby causing the electrodes 20 to have non-planar upper surfaces 32. The recessed areas 26 should be deep enough to maintain a subsequently deposited dielectric material over the electrodes in the MRAM area 16 during subsequent processing using a chemical mechanical polish (CMP).

Figure 3:
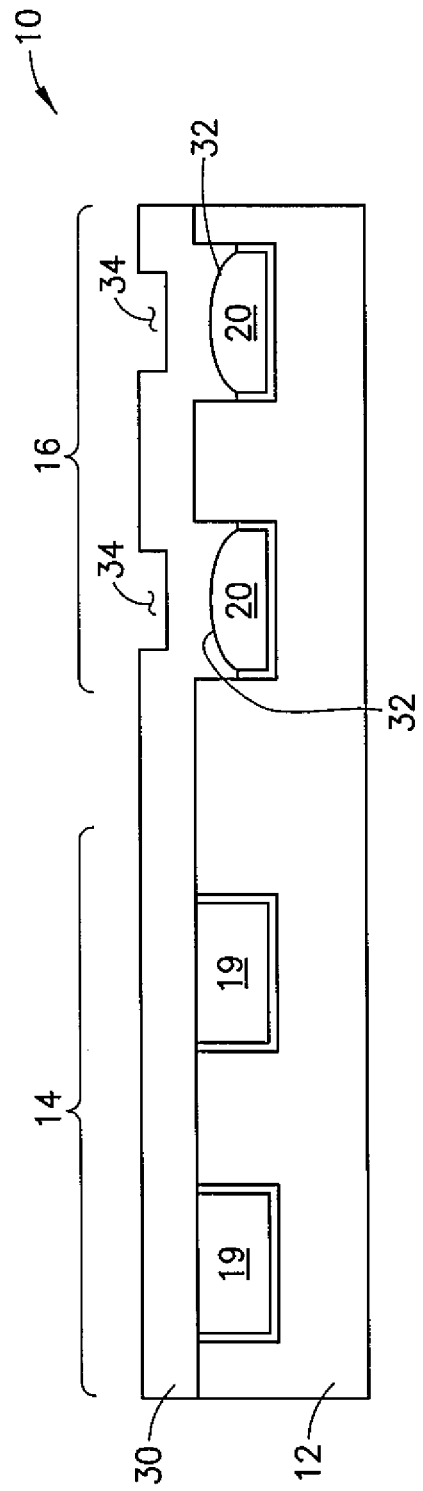

Referring to FIG. 3, the block layer 24 may be stripped from the logic area 14, and a conducting metal cap layer 30 may be deposited over both the logic area 14 and the MRAM area 16. In depositing the conducting metal cap layer 30, conducting metal material is deposited into the recessed areas 26. The non-planar upper surfaces 32 of the electrodes 20 may result in depressions 34 being formed in the conducting metal cap layer 30 over the electrodes 20. The conducting metal cap layer 30 may comprise, for example, TaN, TiN, or the like.

Referring to FIG. 4, the conducting metal cap layer 30 may be removed down to an upper surface of the substrate 12, thereby exposing the wiring patterns 19 in the logic area 14 but leaving the electrodes 20 in the MRAM area 16 covered under caps 38 of dielectric material. Removal of the conducting metal cap layer 30 down to the upper surface of the substrate 12 may be via CMP.

A high-stress metal material used as the conducting metal cap layer 30, when subjected to excessive downforce, however, may separate from the substrate 12. Referring back to FIGS. 1-4, for example, an excessive downforce may result in delamination for low-K types of ILD material, particularly when a CMP process is used to remove the conducting metal cap layer 30 comprising TaN from the substrate 12. Using less downforce in the CMP process may reduce delamination. However, using less downforce may undesirably extend the total processing time and may further compromise the material of the caps 38 covering the electrodes 20. In order to avoid delamination and compromising of the cap material, it may be desirable to improve the integrity of structures by, for example, subjecting the caps 38 to a pre-cleaning process. However, only marginal improvement may be realized for low-k back-end-of-line (BEOL) integration builds without compromising resistance and capacitance.

Furthermore, depths of recesses in which the electrodes 20 are disposed may result in a control issue in that the depths may vary from wafer to wafer. More specifically, a loading effect may be realized in which some of the recesses formed in the substrate 12 are deeper than others, which may result in non-uniformity in the depths of the electrodes 20 and may result in topography prior to MTJ layer deposition compromising MRAM device performance.

Referring to FIGS. 5 through 7, one exemplary embodiment of a method of forming a bottom electrode for an MRAM device 110 is illustrated. In forming the bottom electrode, conducting metal material (for example, TaN or TiN) may be used to avoid delamination of any upper layers from a substrate. As shown in FIG. 5, in forming the bottom electrode, a substrate 112 comprising an ILD material is provided. Substrate 112 may be partitioned into at least one logic area 114 and at least one MRAM area 116, the logic area 114 and the MRAM area 116 being etched to form trenches and subjected to one or more metal deposition processes to form wiring patterns 119 and electrodes 120 in the trenches of the substrate 112. The electrodes 120 may comprise any conductive metal suitable for forming points of electrical contact between an MRAM structure and a transistor. Suitable conductive metals include, but are not limited to, non-ferromagnetic metals suitable for BEOL processing such as copper, tungsten, aluminum, and the like, as well as alloys thereof. Diffusion barriers 122 may also be located between the electrodes 120 and the substrate 112 on the sides and bottom surfaces of the electrodes 120, such diffusion barriers 122 comprising but not limited to, for example, TaN, TiN, and the like. Conducting metal caps 138 may be selectively deposited on the electrodes 120 using CVD (chemical vapor deposition) technique and on upper surfaces of the sides of the diffusion barriers 122, such caps 138 comprising but not limited to, for example, ruthenium. A cap layer 140 may be deposited over both the logic area 114 and the MRAM area 116 such that exposed upper surfaces of the caps 138 and the upper surface of the substrate 112 are covered. The cap layer 140 may comprise a high stress material such as one or more of TaN, TiN, tungsten, ruthenium, or the like, or any non-ferromagnetic metal, using PVD (physical vapor deposition) or CVD techniques and may be about 30 nanometers (nm) to about 60 nm thick. The cap 138 may serve as a copper electromigration layer as well as an etch stop layer for patterning the cap layer 140.

Referring now to FIG. 6, in order to avoid CMP processing on the high stress material of the cap layer 140 and in an effort to avoid delamination, the cap layer 140 is patterned and subjected to an anisotropic RIE process. The patterning is such that the RIE process removes the cap layer 140 on the logic area 114 and the MRAM area 116 but leaves portions of the cap layer 140 over the electrodes 120 in the MRAM area 116.

Referring now to FIG. 7, a dielectric cap layer 144 may be deposited on the logic area 114 and MRAM area 116. The dielectric cap layer 144 may be, but is not limited to, a nitrogen-doped silicon carbide (SiC) (such as NBLOK, which is available from Applied Materials, Inc., of Santa Clara, Calif.), a silicon nitride (SiN), or the like to prevent oxidation of the material of the wiring patterns 119 and the electrodes 120. The dielectric cap layer 144 may be deposited by, for example, PVD, CVD, or plasma enhanced chemical vapor deposition (PECVD). After deposition of the dielectric cap layer 144, planarization via CMP may be carried out to allow the cap layers 140 over the electrodes 120 in the MRAM area 116 to be exposed. Once the dielectric cap layer 144 is planarized, an MTJ stack (magnetized ferromagnetic layers separated by a thin insulating layer that forms a tunnel barrier) may be formed over the electrodes 120 in the MRAM area 116.

Figure 10:
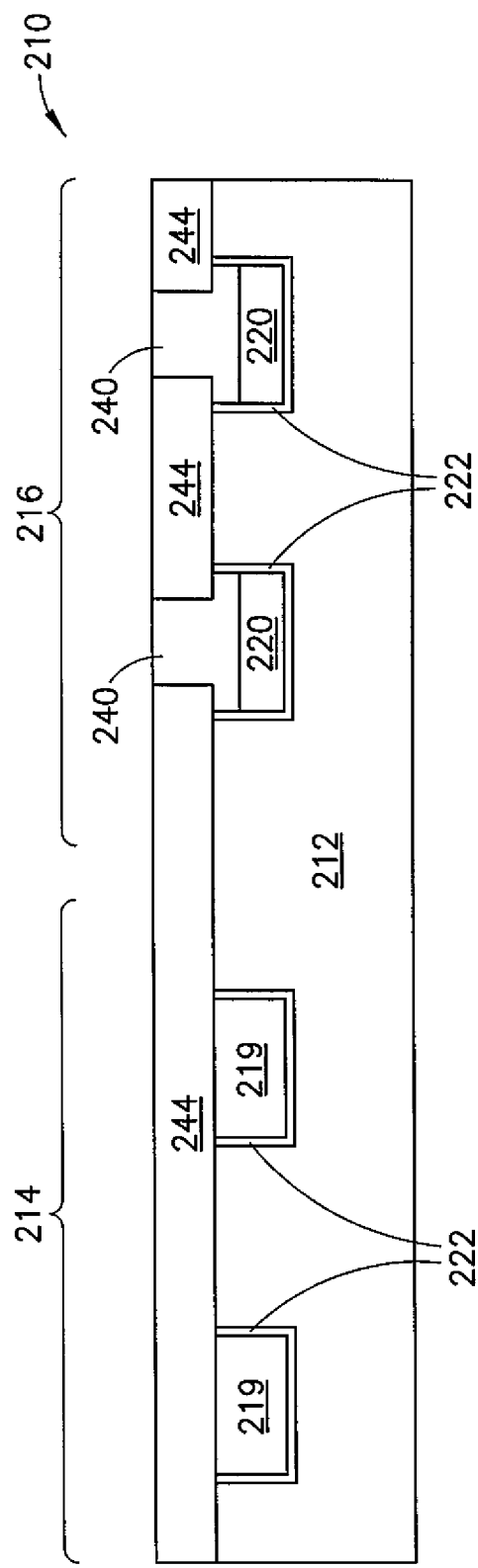

Referring now to FIGS. 8 through 10, one exemplary embodiment of a method of forming a hybrid bottom electrode of an MRAM device 210 is illustrated. This method may provide a solution to avoid exposure of bottom metal of the electrodes. As shown in FIG. 8, a substrate 212 comprising an ILD material is provided and partitioned into at least one logic area 214 and at least one MRAM area 216, the logic area 214 and the MRAM 216 being etched using an anisotropic RIE process and subjected to one or more deposition processes to form wiring patterns 219 and electrodes 220 (and diffusion barriers 222) in trenches in the substrate 212. The electrodes 220 may comprise any suitable conductive metal, such as copper, tungsten, aluminum, or the like, as well as alloys thereof. The diffusion barriers 222 may comprise, for example, TaN, TiN, or the like. A dielectric cap layer 244 may be deposited over both the logic area 214 and the MRAM area 216. The dielectric cap layer 244 may be a nitrogen-doped SiC (such as NBLOK), a SiN, or the like to prevent oxidation of the material of the wiring patterns 219 and the electrodes 220. The dielectric cap layer 244 may be opened (for example, using RIE) over the electrodes 220 of the MRAM area 216 to form open areas 225 for connection of an MTJ stack to the bottom electrode.

Referring to FIG. 9, the material of the electrodes 220 in the MRAM area 216 is recessed through the open areas 225 using an isotropic RIE or wet process to form recessed areas 235 below the open areas 225 and over the remaining material of the electrodes 220.

Referring to FIG. 10, cap layers 240 are deposited through the open areas 225 and into the recessed areas 235 to fill the recessed areas 235. Deposition of the material of the cap layers 240 (which may comprise, for example, TaN or TiN) may be by any kind of conformal deposition processes including CVD, PECVD, or ALD (atomic layer deposition). The dielectric cap layer 244 and the metal cap layers 240 over the electrodes 220 in the MRAM area 216 may be planarized by CMP. The dielectric cap layer 244 (the SiC or SiN) may be eroded during subsequent processing, but the cap layers 240 will remain in place to cover the electrodes 220 in the MRAM area 216. In such embodiments, the width of the cap is designed to be smaller than the target width of the MTJ pillar bottom. In that case, the metal cap which is hidden under the bottom of the MTJ may eliminate a source of re-deposition of the cap material onto the sidewall of the MTJ pillar causing shortage across the magnetic junction. In any event of excessive loss of dielectric cap layer 244 during an IBE (Ion Beam Etching) process and the start of the etching of the bottom electrode 220, this cap layer may prevent revealing of the bottom metal of the electrodes 220. Revealing the bottom electrode (for example, the copper) can lead to contamination of the IBE chamber.

Figure 11:
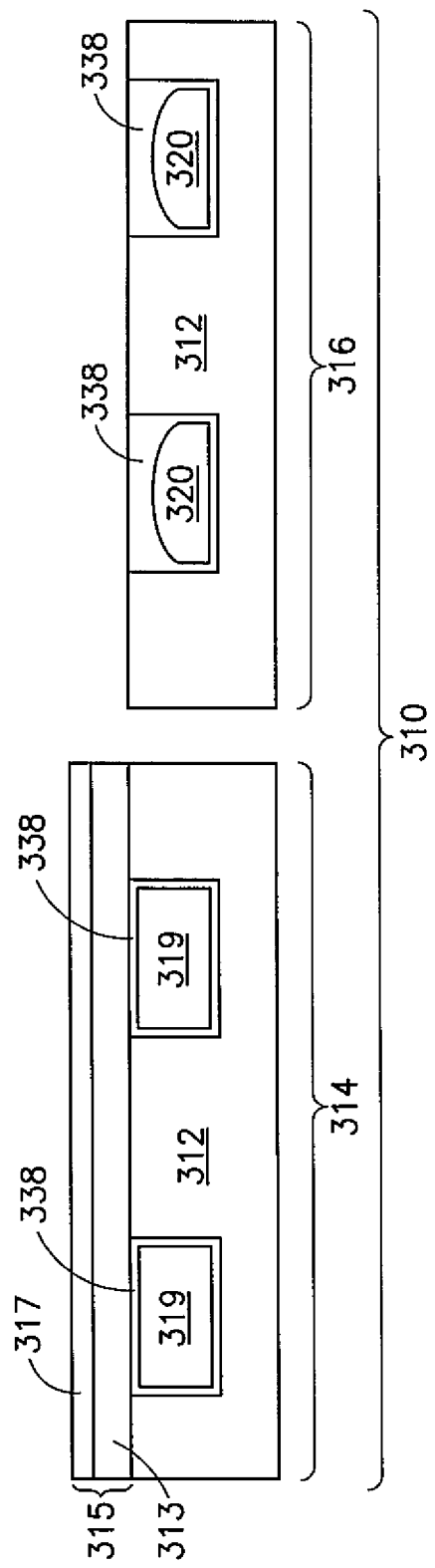
FIGS. 11 through 13 are schematic representations of a currently employed method of forming an MTJ stack over an electrode.
Figure 12:
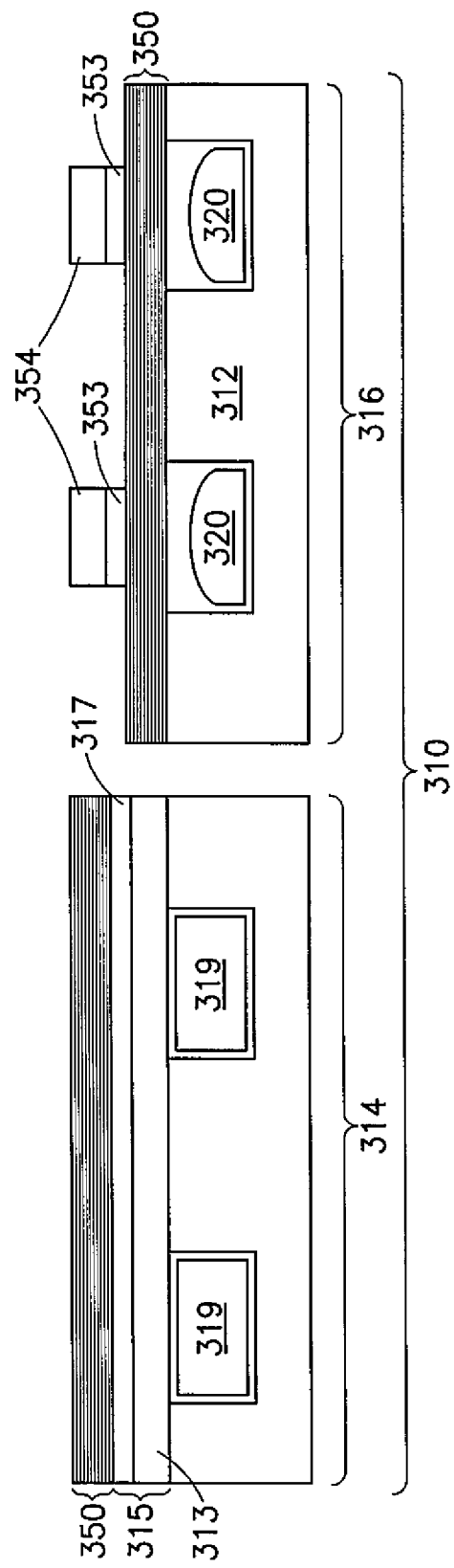
Figure 13:
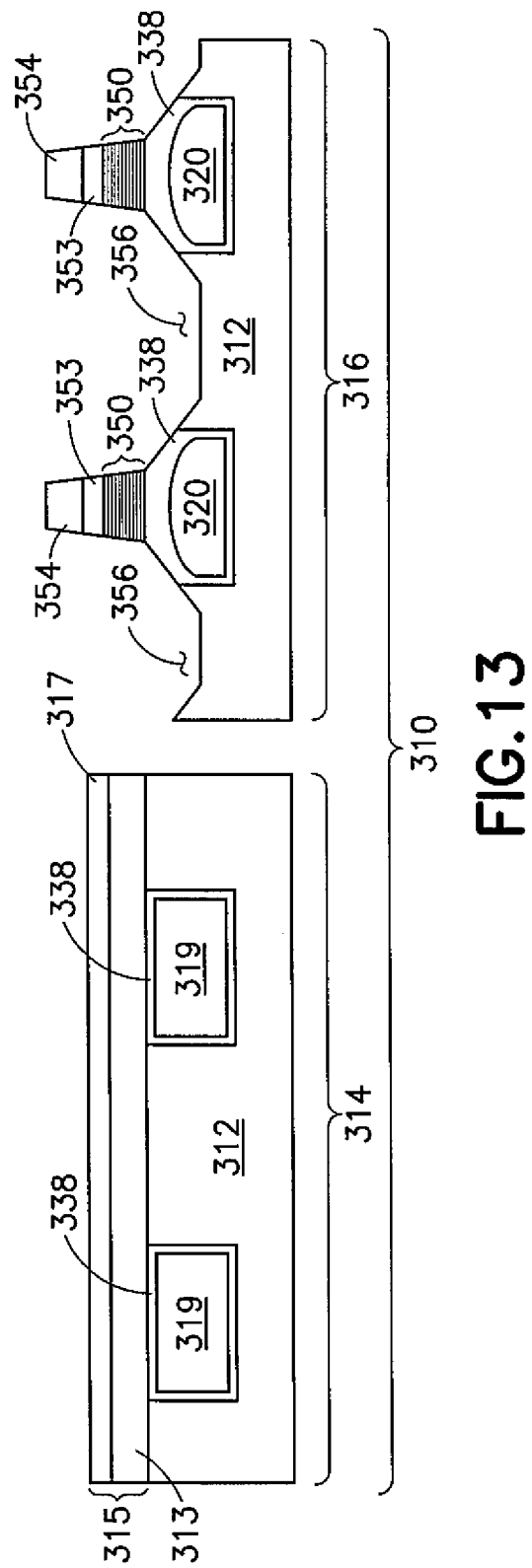

In order to further provide technological context, FIGS. 11 through 13 illustrate a conventional method of MTJ stack formation over a bottom electrode. A bottom electrode can be formed with any existing method including the methods described in previous text. A current scheme for MTJ stack formation involves a non-chemical approach using physical sputtering ion beam milling etching (IBE) techniques using a tilt angle. Scalability issues may be experienced with such an approach. Furthermore, the chemistry of RIE processes generally utilizes fluorine and chlorine, both of which may compromise MTJ properties.

Referring to FIG. 11, an MRAM device 310 may comprise a substrate 312 of ILD material having wiring patterns 319 in a logic area 314 and electrodes 320 in an MRAM area 316. The wiring patterns 319 and the electrodes 320 may be covered under caps 338 of dielectric material, and the logic area 314 may be blocked with a hardmask 315. The hardmask 315 may comprise single hard mask or multiple layers, for example, a layer 317 and a layer 313. The materials of these layers can be sacrificial dielectric or metal layer or a combination of both. As shown in FIG. 12, an MTJ stack 350 may be deposited on the hardmask 315 over the logic area 314 and also over the MRAM area 316. A hardmask 354 and top electrode hardmask layer 353 (for example, TaN or TiN) may be deposited on the MTJ stack 350. The hardmask 354 and top electrode hardmask layer 353 may be patterned using lithography and RIE process techniques in the MRAM area 316 to form an MTJ pillar hardmask over the MTJ layer and the bottom electrodes 320 in the MRAM area 316. As shown in FIG. 13, an IBE milling technique may be used to form the MTJ stack 350 over each of the electrodes 320 with hardmask 354. The extensive IBE milling technique to make MTJ pillar profiles vertical and to clean up the sidewalls of the MTJ to prevent shortage across the junction tends to damage and cause a deep gouge into the ILD material of the substrate 312, thereby forming significant depressions 356 in the substrate 312 for the tight pitch of MTJ pillars. The top electrode hardmask 353, the MTJ stack 350, and some of the sacrificial hardmask 315 in the logic area 314 are etched away by IBE while MTJ pillars are formed in the MRAM device region. The remaining sacrificial hardmask 315 is removed with a wet or dry etch process. This known process tends to cause excessive recesses in material of the substrate 312. Therefore, carrying out subsequent ILD processing over high incoming topography in the MRAM area 316, which includes MTJ pillars with deep ILD recesses, may be challenging. More particularly, it may challenging to form a top electrode contact layer over the MTJ in the MRAM area 316 as well as to carry out normal BEOL processing in the logic area 314.

Referring now to FIGS. 14-17, one exemplary embodiment of a method for forming an MTJ stack 450 on a bottom electrode of an MRAM device 410 is illustrated. An IBE milling technique may be used to mill deposited layers to form the MTJ stack 450. The milling may involve forming a foot 466 at each side of the formed MTJ stack 450 in the MRAM area 416, forming spacers 485, and using an anisotropic RIE process to trim off portions of the foot 466.

Figure 14:
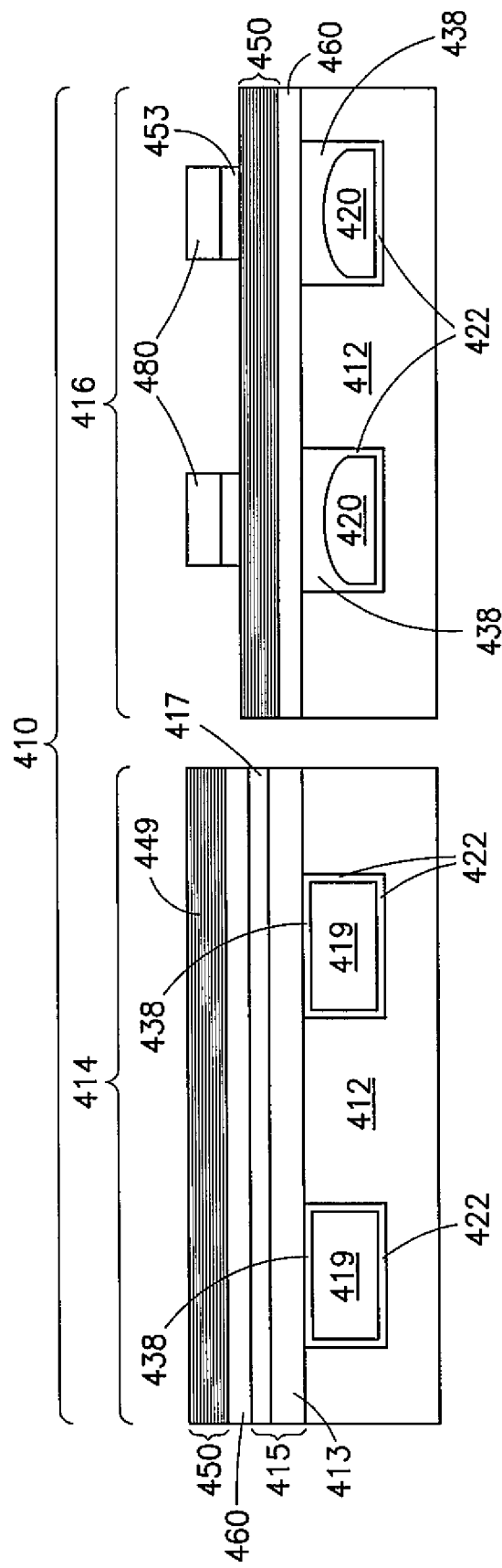
FIGS. 14 through 17 are schematic representations of one exemplary embodiment of forming an MTJ stack over an electrode of an MRAM device.

Referring now to FIG. 14, an initial step in forming the MTJ stack 450 may comprise providing the substrate 412 comprising the ILD material and having at least one logic area 414 and at least one MRAM area 416, with wiring patterns 419 and electrodes 420, diffusion barriers 422 on the sides and bottoms of each, and caps 438 disposed on the tops of each. As indicated above, the electrodes 420 may comprise any conductive metal suitable for forming points of electrical contact between an MRAM structure and a transistor, such conductive metals including, for example, copper, aluminum, and the like, as well as alloys thereof. The diffusion barriers 422 may comprise, for example, TaN, TiN, or the like.

A hardmask 415 (which may be a layer 417 and a layer 413) may be disposed on the substrate 412 to mask off the wiring patterns 419 in the logic area 414. An additional conducting metal layer 460 (for example, TaN and/or TiN) may be deposited on an upper surface of the hardmask 415 and on an upper surface of the substrate 412 over the MRAM area 416. A plurality of MTJ layers 449 may then be deposited on the additional conducting metal layer 460 using PVD (physical vapor deposition) or PECVD to form the MTJ stack 450. A top electrode hardmask layer may then be deposited on the MTJ layers 450, the top electrode hardmask layer 453 comprising, for example, TaN, TiN, or any other hardmask metal. A stack hardmask 480 may be deposited on the hardmask metal layer 453 and patterned in the MRAM area 416 with lithography and RIE process techniques. The stack hardmask 480 may comprise, for example, a silicon nitride, a silicon dioxide, or the like.

Figure 15:
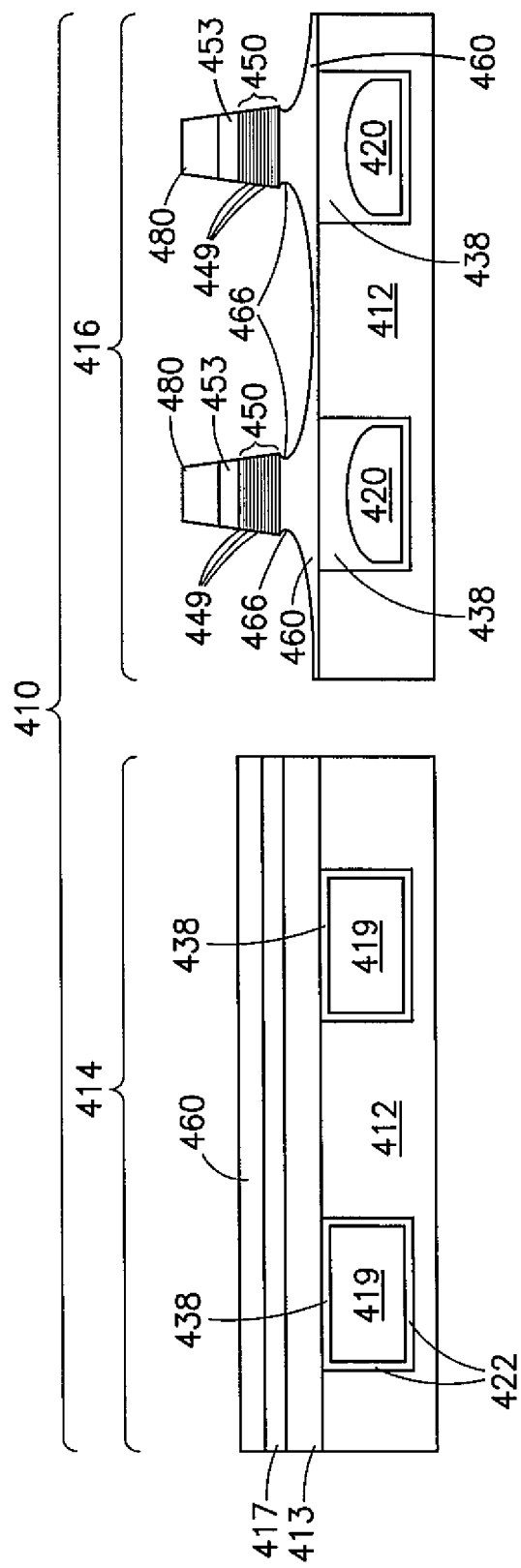

Referring now to FIG. 15, the MTJ stack 450 and the top hardmask metal layer 453 on the MRAM area 416 may be milled using the IBE milling technique to form MTJ pillars. The milling technique may also be such that the foot 466 is formed at each side of the base of the MTJ stack 450 before exposing the ILD of the substrate 412.

Figure 16:
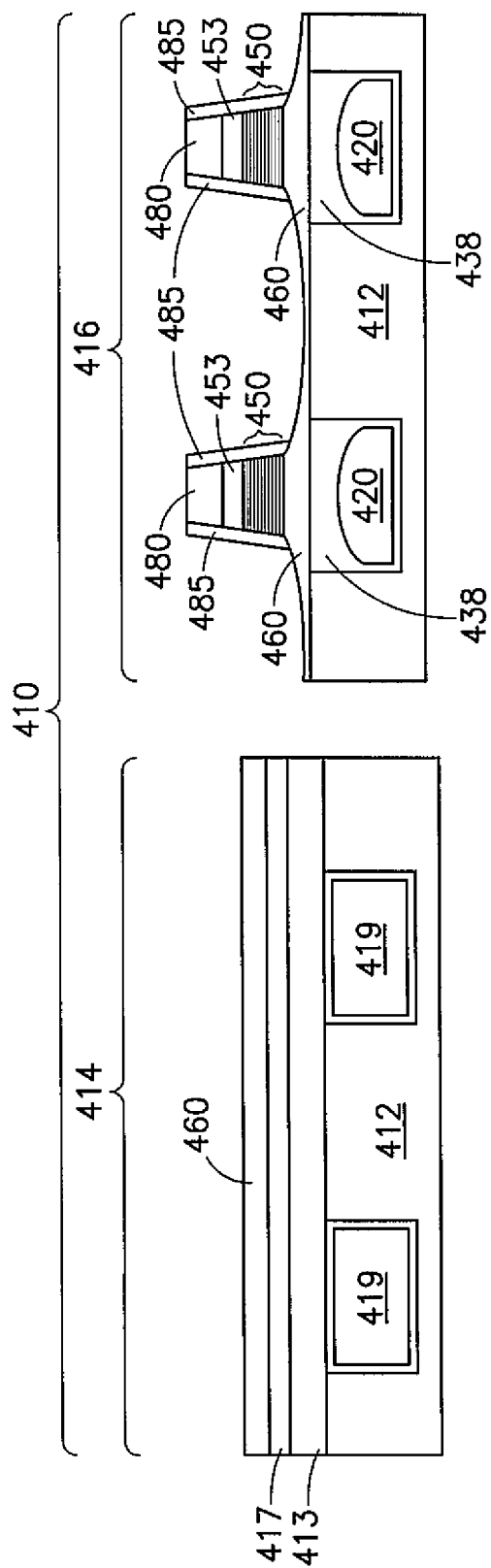

Referring now to FIG. 16, spacers 485 may be formed on sides of the MTJ stack 450, the top hardmask layer 453, the stack hardmask 480, and some upper portions of bottom metal layer 460. The spacers 485 may comprise one of more of SiN, SiC, or any material that is resistant to RIE or wet etch processes, or the like, and may be deposited by conformal deposition of the spacer material followed by an anisotropic RIE process. Lower ends of the spacers 485 may fill in the feet 466 at each side of the base of the MTJ stack 450. The spacers 485 provide protection to sidewalls of the MTJ stack 450 during subsequent processing.

Figure 17:
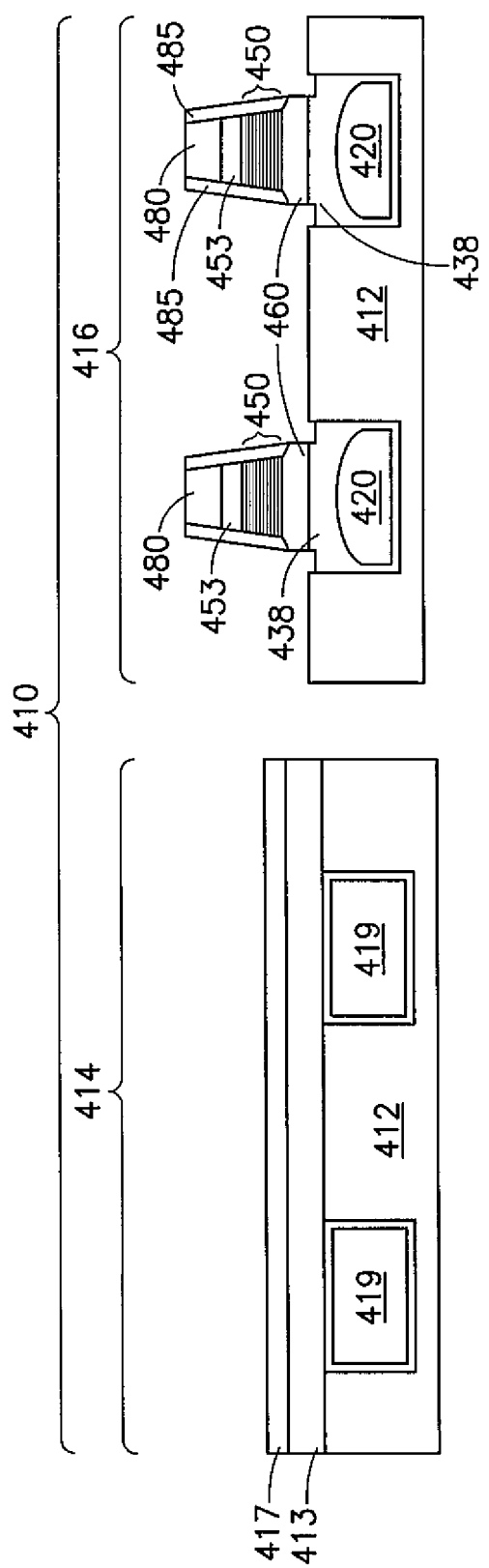

Referring now to FIG. 17, both the logic area 414 and the MRAM area 416 may be subjected to an RIE process to remove the additional layer 460 but selectively leave the ILD material of the substrate 412. The RIE process may further remove some of the metal caps 438 over the electrodes 420. The resulting structure is an MRAM device 410 having a MTJ stack 450 with an underlying metal structure that forms the bottom electrode 420. The metal cap 438 and the additional layer 460 are positioned under the MTJ stack 450 in order to provide additional space between the bottom electrode 420 and the MTJ stack 450, while the MTJ stack 450 is protected by the spacers 485.

Figure 18:
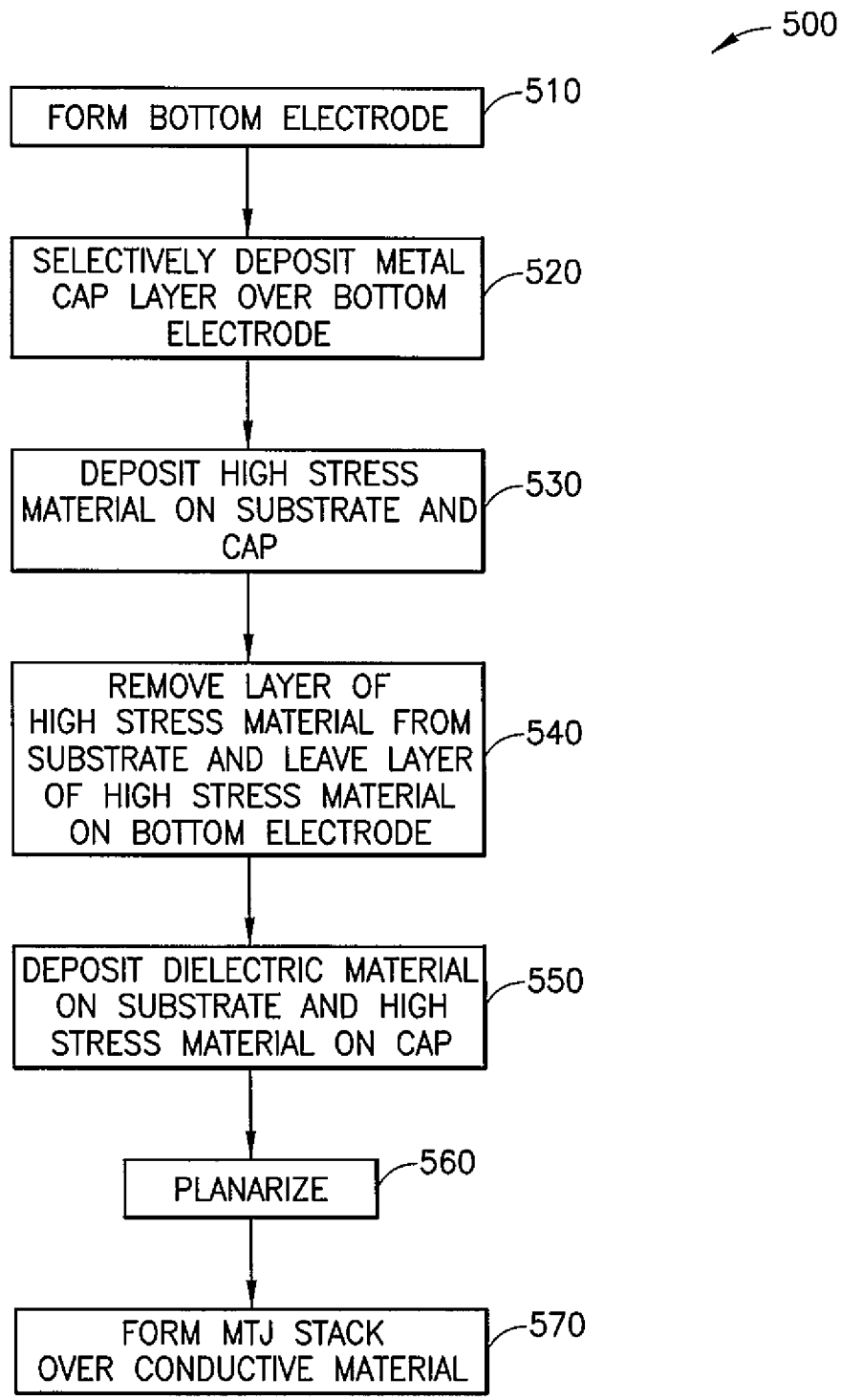
FIG. 18 is a flow diagram of one exemplary method of forming an electrode for an MRAM device.

Referring now to FIG. 18, a flow of one exemplary embodiment of a method illustrating the formation of an electrode for MRAM or an MRAM device is shown generally at 500 and is hereinafter referred to as "method 500." In method 500, a substrate of ILD material may be provided, trenches may be formed, diffusion barriers may be deposited, conductive material (such as copper) may be deposited, and CMP may be carried out to form a bottom electrode in the MRAM area as shown at 510. As shown at 520, a cap (such as ruthenium) may be deposited on the bottom electrode. As shown at 530, a high stress material (such as TaN or TiN) may be deposited on the substrate and the cap. Patterning of the high stress material from the substrate may then be carried out, as indicated at 540, while leaving the high stress material on the cap. Patterning may be by anisotropic RIE. As shown at 550, a dielectric material (such as n-doped SiC or SiN) may be deposited on the substrate and on the patterned bottom electrode. As shown at 560, the dielectric material may be planarized. An MTJ stack may then be formed on the dielectric material over the conductive material, as shown at 570.

Figure 19:
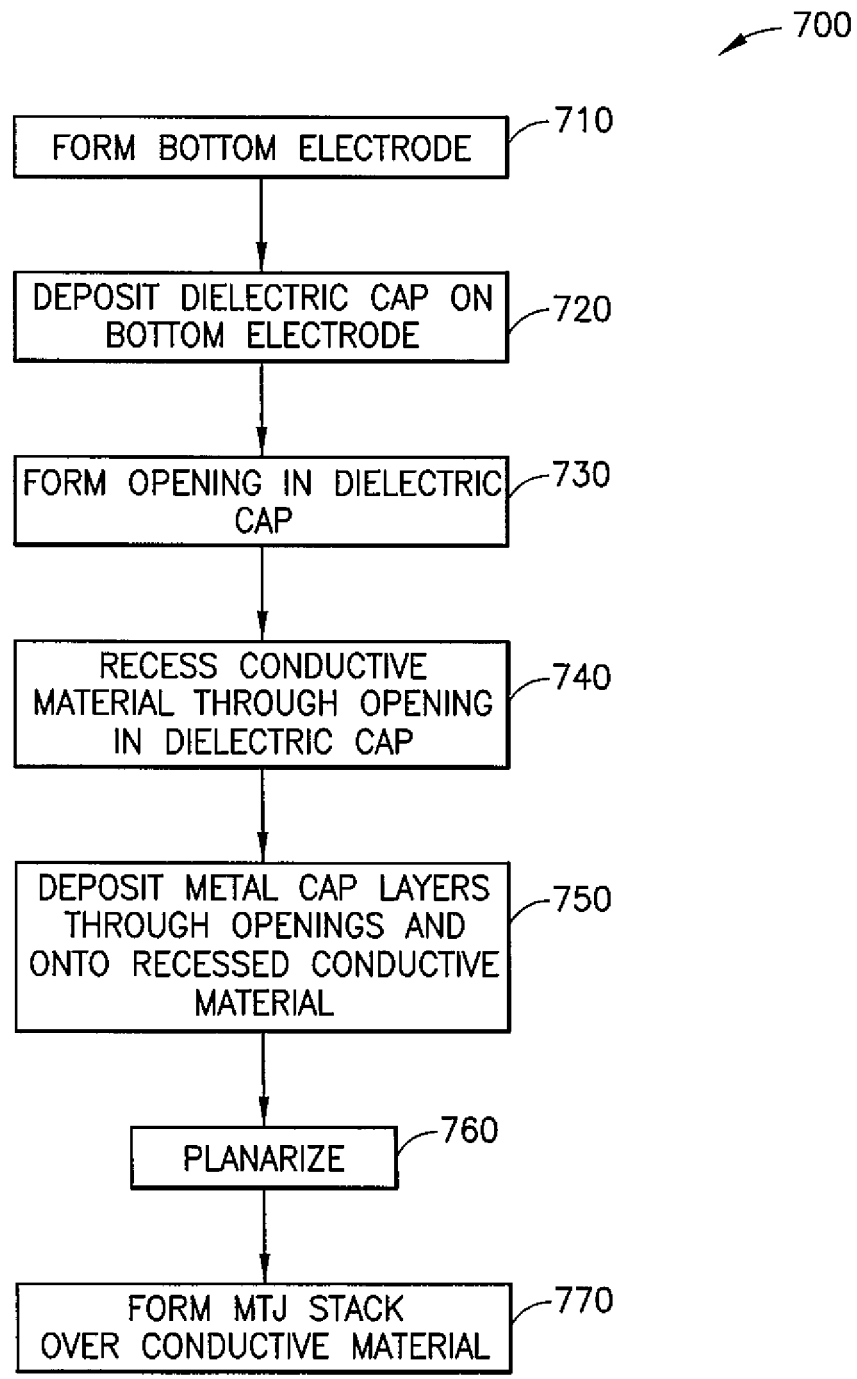
FIG. 19 is a flow diagram of another exemplary method of forming an electrode for an MRAM device.

Referring now to FIG. 19, a flow of another exemplary embodiment of a method illustrating the formation of an electrode for MRAM or an MRAM device is shown generally at 700 and is hereinafter referred to as "method 700." In method 700, a substrate of ILD material may be provided, trenches may be formed, diffusion barriers may be deposited, conductive material (such as copper) may be deposited, and a CMP may be carried out to form a bottom electrode in the MRAM area, as shown at 710. As shown at 720, a dielectric cap may be deposited on the bottom electrode. As shown at 730, an opening may be formed in the dielectric cap. The conductive material may then be recessed through the opening formed in the dielectric cap, as indicated at 740. As shown at 750, metal cap layers may be deposited through the openings and onto the conductive material. As shown at 760, a planarization may then be carried out. An MTJ stack may then be formed over the conductive material, as shown at 770.

Figure 20:
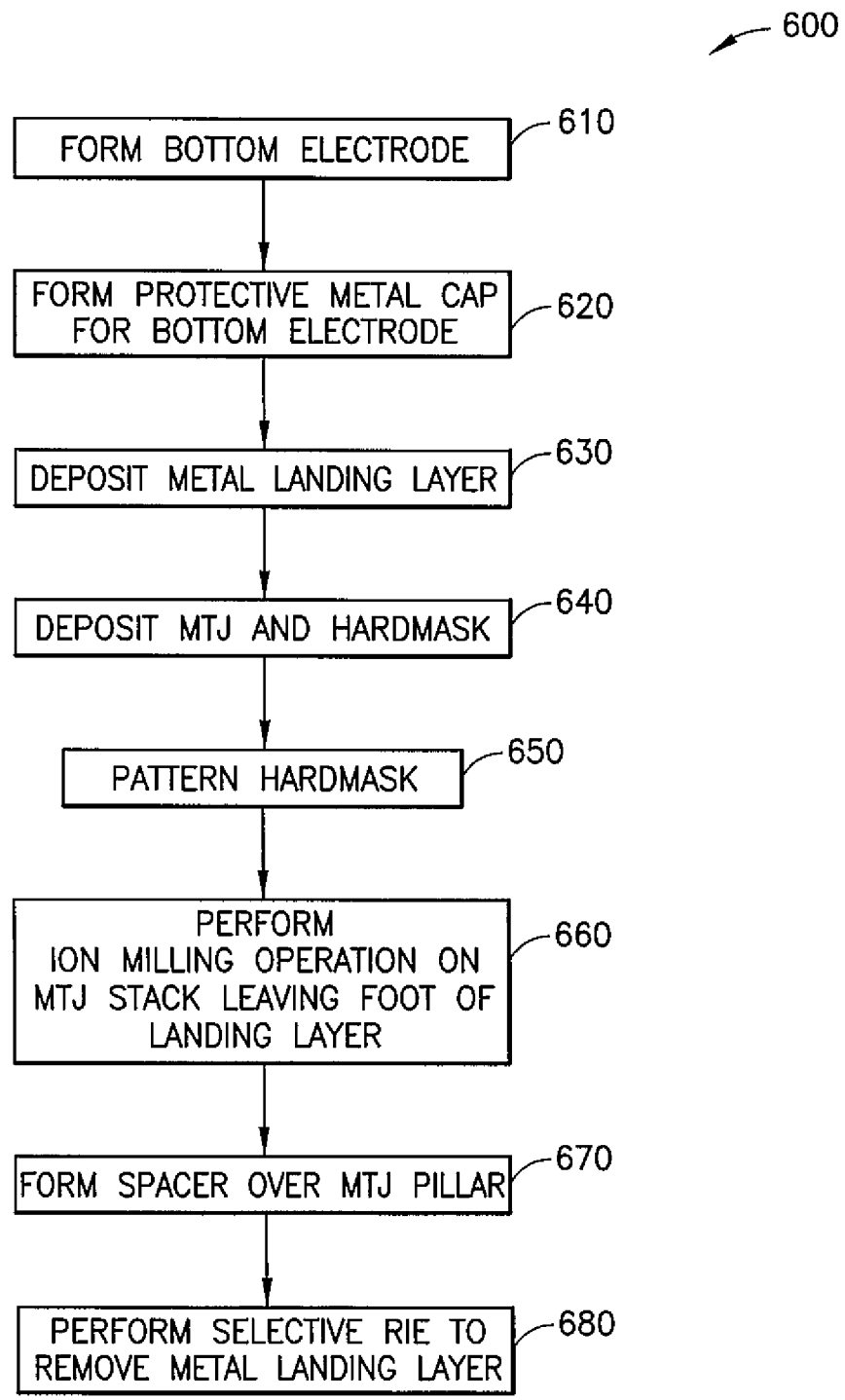
FIG. 20 is a flow diagram of one exemplary method of forming a magnetic tunnel junction for an MRAM device.

Referring now to FIG. 20, a flow of one exemplary embodiment of a method illustrating the formation of an MTJ for MRAM or an MRAM device is shown generally at 600 and is hereinafter referred to as "method 600." In method 600, a bottom electrode may be formed, as indicated at 610. A protective metal cap may then be formed for the bottom electrode, as indicated at 620. At 630, a metal landing layer may be deposited, and at 640, MTJ and hardmask may be deposited. The hardmask may be patterned, as indicated at 650. Ion milling of the MTJ stack may then be carried out, as indicated at 660. In doing so, the foot of the landing layer may be left. As indicated at 670, spacers may be formed over the MTJ pillar. Selective RIE may then be carried out, as indicated at 680, to remove the metal landing layer.

In one example, a method of forming a bottom electrode for MRAM comprises: depositing a conductive material into a trench in a substrate; depositing a cap on the conductive material; depositing a layer of high stress material on upper surfaces of the substrate and the cap; patterning the high stress material to remove the layer of high stress material on the upper surfaces of the substrate and leaving the layer of high stress material on the upper surfaces of the cap; depositing a layer of dielectric material on the upper surfaces of the substrate and on upper surfaces of the high stress material on the cap; planarizing the layer of dielectric material; and forming a magnetic tunnel junction stack on the dielectric material over the conductive material.

The method may further comprise forming diffusion barriers between the substrate and the sides and bottom of the conductive material. The layer of high stress material on upper surfaces of the substrate and the cap may be deposited to a thickness of about 30 nm to about 60 nm. The etching of the layer of high stress material may comprise patterning the layer of high stress material and using an anisotropic reactive ion etch. The conductive material may be one or more of copper, aluminum, and tungsten. The cap on the conductive material may be ruthenium. The layer of high stress material on upper surfaces of the substrate and the cap may be, but is not limited to, one or more of TaN, TiN, and tungsten.

In another example, a method of forming a hybrid bottom electrode for MRAM comprises: depositing a conductive material into a trench in a substrate; depositing a dielectric cap on the conductive material; forming an opening in the dielectric cap to expose the conductive material; recessing the conductive material through the opening; depositing a metal cap layer on the conductive material through the opening; planarizing the metal cap layer and the dielectric cap; and forming a magnetic tunnel junction stack over the conductive material.

The method may further comprise forming diffusion barriers between the substrate and the sides and bottom of the conductive material. Forming an opening in the dielectric cap may comprise using a first anisotropic reactive ion etch. Recessing the conductive material through the opening may comprise using an isotropic RIE or wet process. Depositing a metal cap layer on the conductive material may comprise depositing one or more of titanium nitride and tantalum nitride using chemical vapor deposition, plasma enhanced chemical vapor deposition, or atomic layer deposition.

In another example, a method of forming a magnetic tunnel junction for MRAM comprises: providing a substrate having a bottom electrode; depositing a layer of conducting metal material on upper surfaces of the substrate and the bottom electrode; depositing a plurality of magnetic tunnel junction layers on the layer of conducting metal material; depositing a top electrode hardmask layer on an upper layer of the plurality of magnetic tunnel junction layers; depositing a stack hardmask on an upper surface of the top electrode hardmask layer; forming top hardmask patterning; milling the top electrode hardmask layer, the plurality of magnetic tunnel junction layers, the layer of conducting metal material, and the substrate to form a magnetic tunnel junction stack having tapered side surfaces; forming spacers on the tapered side surfaces; and etching to remove the conducting metal material on the upper surface of the substrate and leaving the layer of conducting metal material under the spacers and the plurality of magnetic tunnel junction layers.

The method may further comprise forming diffusion barriers between the substrate and the sides and bottom of the electrode. The milling may form a foot in the layer of conducting metal material along sides of the plurality of magnetic tunnel junction layers. The foot may cause the layer of conducting metal material to slope away from the plurality of magnetic tunnel junction layers. Forming the spacers on the tapered side surfaces may comprise conformally depositing one or more of SiN and SiC and anisotropically etching the conformally deposited one or more of SiN and SiC. Etching may be carried out to remove the layer of conducting metal material selectively without damaging ILD material.

In another example, a structure for MRAM comprises: a substrate of interlayer dielectric material; an electrode comprising a conductive material disposed in a trench in the substrate; a cap material disposed on an upper surface of the electrode; a layer of conducting metal material disposed on the cap material; a plurality of magnetic tunnel junction layers disposed on the layer of conducting material; a top electrode hardmask layer disposed on an upper layer of the plurality of magnetic tunnel junction layers; a stack hardmask disposed on an upper surface of the top electrode hardmask layer; and one or more spacers disposed alongside surfaces of the layer of conducting metal material, the plurality of magnetic tunnel junction layers, the top electrode hardmask layer, and the stack hardmask. The one or more spacers are tapered in a direction of the layer of conducting metal material, the plurality of magnetic tunnel junction layers, the top electrode hardmask layer, and the stack hardmask.

The conductive material of the electrode may comprise copper. The structure may further comprise diffusion barriers between the substrate and the sides and bottom of the electrode. The layer of conducting metal material may comprise one or more of TaN and TiN. The top electrode hardmask layer may comprise one or more of TaN and TiN. The stack hardmask may comprise a silicon nitride or a silicon dioxide. The spacers may comprise SiN or SiC.

In the foregoing description, numerous specific details are set forth, such as particular structures, components, materials, dimensions, processing steps, and techniques, in order to provide a thorough understanding of the exemplary embodiments disclosed herein. However, it will be appreciated by one of ordinary skill of the art that the exemplary embodiments disclosed herein may be practiced without these specific details. Additionally, details of well-known structures or processing steps may have been omitted or may have not been described in order to avoid obscuring the presented embodiments. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The description of the present invention has been presented for purposes of illustration and description, but is not intended to be exhaustive or limiting in the form disclosed. Many modifications and variations will be apparent to those of ordinary skill in the art without departing from the scope of the invention. The embodiments were chosen and described in order to best explain the principles of the invention and the practical applications, and to enable others of ordinary skill in the art to understand the invention for various embodiments with various modifications as are suited to the particular uses contemplated.

What is claimed is:

1. A method of foaming a bottom electrode with a metal cap for MRAM, the method comprising:
    depositing a conductive material into a trench in a substrate and planarizing;
    depositing a metal cap into the trench and on the conductive material;
    depositing a layer of high stress material on upper surfaces of the substrate and on the metal cap;
    patterning the high stress material;
    etching to selectively remove the layer of high stress material from the upper surfaces of the substrate and from a first portion of the metal cap and leaving the layer of high stress material on a second portion of the metal cap;
    depositing a layer of dielectric material on the upper surfaces of the substrate and on upper surfaces of the high stress material on the metal cap;
    planarizing the layer of dielectric material; and
    forming a magnetic tunnel junction stack on the dielectric material over the conductive material.

2. The method of claim 1, further comprising forming diffusion barriers between the substrate and the sides and bottom of the conductive material.

3. The method of claim 1, wherein the layer of high stress material on upper surfaces of the substrate and the metal cap is deposited to a thickness of about 30 nm to about 60 nm.

4. The method of claim 1, wherein the etching of the layer of high stress material comprises patterning the layer of high stress material and using an anisotropic reactive ion etch.

5. The method of claim 1, wherein the conductive material is a non-ferromagnetic back-end-of-line metal material.

6. The method of claim 5, wherein the non-ferromagnetic back-end-of-line metal material is one or more of copper and tungsten.

7. The method of claim 5, wherein the metal cap on the conductive material in the trench is ruthenium.

8. The method of claim 7, wherein the layer of high stress material on upper surfaces of the substrate and the metal cap is one or more of TaN, TiN, tungsten, and ruthenium.

\* \* \* \* \*